United States Patent
JangJian et al.

(10) Patent No.: US 8,889,461 B2
(45) Date of Patent: Nov. 18, 2014

(54) CIS IMAGE SENSORS WITH EPITAXY LAYERS AND METHODS FOR FORMING THE SAME

(75) Inventors: Shiu-Ko JangJian, Tainan (TW); Min Hao Hong, Kaohsiung (TW); Kei-Wei Chen, Tainan (TW); Chih-Cherng Jeng, Madou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/620,322

(22) Filed: Sep. 14, 2012

(65) Prior Publication Data
US 2013/0320419 A1   Dec. 5, 2013

Related U.S. Application Data

(60) Provisional application No. 61/652,547, filed on May 29, 2012.

(51) Int. Cl.
*H01L 31/113*  (2006.01)
*H01L 27/146*  (2006.01)

(52) U.S. Cl.
CPC ................ *H01L 27/14616* (2013.01)
USPC 438/70; 257/292; 257/E27.132; 257/E27.133

(58) Field of Classification Search
CPC ............. H01L 27/14612; H01L 27/14616; H01L 27/14687; H01L 27/14647
USPC ......................... 257/440, 443; 438/70
See application file for complete search history.

(56) References Cited

U.S. PATENT DOCUMENTS

| | | | |
|---|---|---|---|
| 6,949,809 B2* | 9/2005 | Takimoto et al. | 257/463 |
| 7,449,712 B2 | 11/2008 | Cha | |
| 7,777,259 B2 | 8/2010 | Kim | |
| 8,154,062 B2* | 4/2012 | Park | 257/291 |
| 8,164,124 B2* | 4/2012 | Liu et al. | 257/288 |
| 2011/0226936 A1* | 9/2011 | Pain et al. | 250/214.1 |

FOREIGN PATENT DOCUMENTS

| | | |
|---|---|---|
| KR | 100625944 | 9/2006 |
| KR | 20060113295 | 11/2006 |
| KR | 101146590 | 5/2012 |

* cited by examiner

*Primary Examiner* — John C Ingham
(74) *Attorney, Agent, or Firm* — Slater and Matsil, L.L.P.

(57) ABSTRACT

A method includes performing a first epitaxy to grow a first epitaxy layer of a first conductivity type, and performing a second epitaxy to grow a second epitaxy layer of a second conductivity type opposite the first conductivity type over the first epitaxy layer. The first and the second epitaxy layers form a diode. The method further includes forming a gate dielectric over the first epitaxy layer, forming a gate electrode over the gate dielectric, and implanting a top portion of the first epitaxy layer and the second epitaxy layer to form a source/drain region adjacent to the gate dielectric.

21 Claims, 8 Drawing Sheets

CIS IMAGE SENSORS WITH EPITAXY LAYERS AND METHODS FOR FORMING THE SAME

This application claims the benefit of the following provisionally filed U.S. Patent application: Application Ser. No. 61/652,547, filed May 29, 2012, and entitled "CMOS Image Sensor;" which application is hereby incorporated herein by reference.

BACKGROUND

Image sensor chips, which include front side image sensor chips and Backside Illumination (BSI) image sensor chips, are widely used in applications such as cameras. In the formation of image sensor chips, image sensors (such as photo diodes) and logic circuits are formed on a silicon substrate of a wafer, followed by the formation of an interconnect structure on a front side of the wafer. In the front side image sensor chips, color filters and micro-lenses are formed over the interconnector structure. In the formation of the BSI image sensor chips, after the formation of the interconnect structure, the wafer is thinned, and backside structures such as color filters and micro-lenses are formed on the backside of the silicon substrate. When the image sensor chips are used, light is projected on the image sensors, in which the light is converted into electrical signals.

The image sensors in the image sensor chips generate electrical signals in response to the stimulation of photons. The full well capacity and the signal-to-noise ratio of the image sensors are preferably high. To increase the full well capacity and the signal-to-noise ratio of the image sensors such as photo diodes, the impurity concentrations of the p-type and/or n-type regions of the photo diodes need to be increased, and the depths of the p-type and/or n-type regions of the photo diodes need to be increased also. Such increase, however, results in the requirement of higher implantation energy and higher dosage. Due to the bombardment of the implanted impurities to the semiconductor substrate, the leakage currents of the photo diodes may be increased, and the dark current and white pixel performance of the image sensors is degraded.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods of forming image sensor wafers/chips are provided in accordance with various embodiments. The intermediate stages in the formation of the image sensor wafers/chips are illustrated. The variations of the embodiments are discussed. Throughout the various views and illustrative embodiments, like reference numbers are used to designate like elements.

Figure 1:
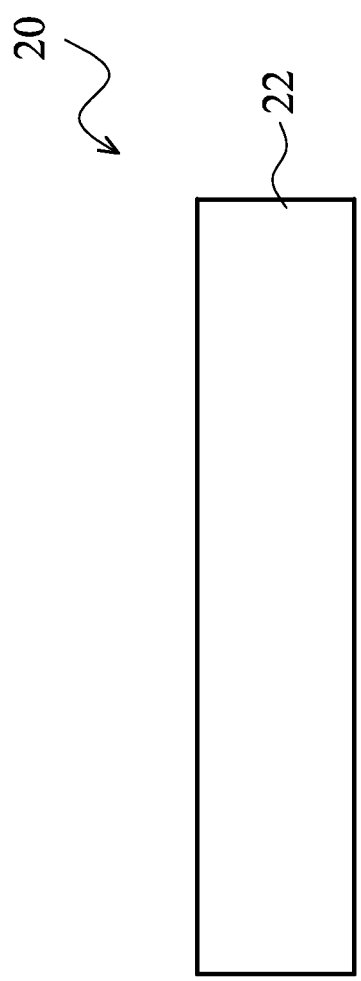
FIGS. 1 through 8 are cross-sectional views of intermediate stages in the manufacturing of an image sensor wafer in accordance with various embodiments.

FIG. 1 illustrates image sensor wafer 20, which includes semiconductor substrate 22. In some embodiments, semiconductor substrate 22 is a crystalline silicon substrate. Alternatively, semiconductor substrate 22 is formed of other semiconductor materials such as silicon germanium, silicon carbon, or the like.

Figure 2:
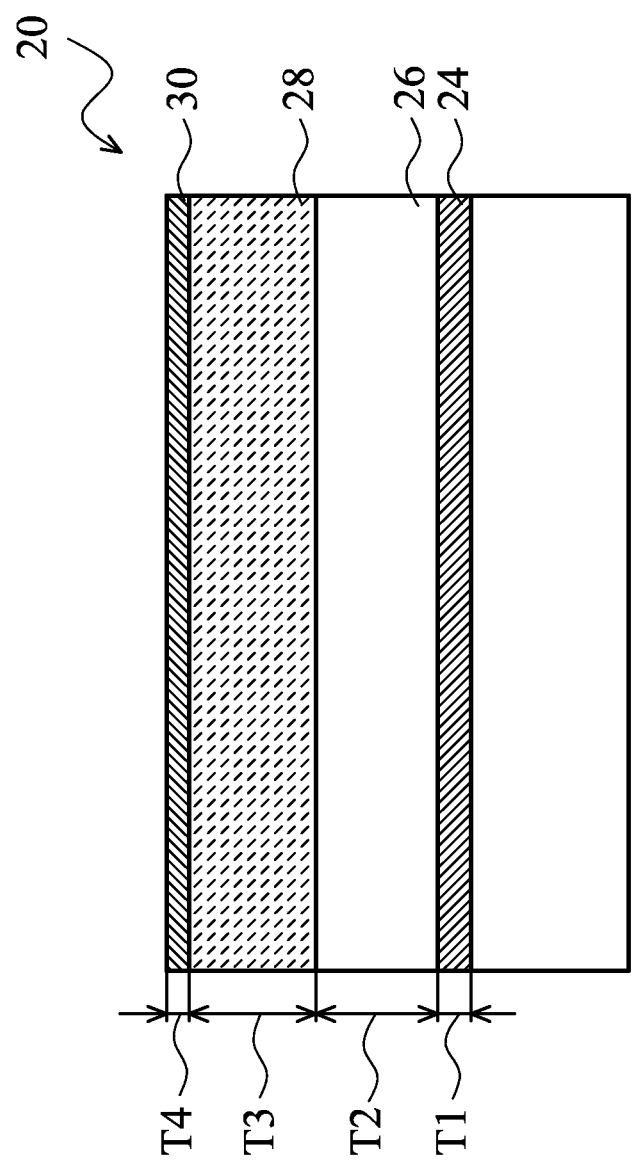

Referring to FIG. 2, a plurality of epitaxy steps is performed to form a plurality of epitaxy layers. In some exemplary embodiments, the epitaxy layers include p-type layer 24, n-type layer 26 on p-type layer 24, n-type layer 28 on n-type layer 26, and p-type layer 30 on n-type layer 28. In alternative embodiments, more epitaxy layers are formed. For example, there may be more n-type layers stacked with n-type layers 24 and 26. In yet alternative embodiments, p-type layer 24 is omitted, and an n-type layer (such as layer 26) is formed over and contacting substrate 22.

In some embodiments, p-type layer 24 is a silicon layer. In alternative embodiments, p-type layer 24 is a silicon germanium layer. The atomic percentage of germanium in p-type layer 24 may be between about 20 percent and about 40 percent, for example. With the proceeding of the epitaxy of p-type layer 24, a p-type impurity such as boron, indium, or combinations thereof, is in-situ doped. The doped impurity concentration may be between about $1\times10^{16}/cm^3$ and about $1\times10^{19}/cm^3$, for example. It is appreciated, however, that the values recited throughout the description are merely examples, and may be changed to different values. In some embodiments, p-type layer 24 has a substantially uniform doping concentration from the bottom to the top. Thickness T1 of p-type layer 24 may be between about 10 nm and about 2 μm, for example.

N-type layer 26 may be a silicon layer, which may be substantially free from germanium, although germanium may also be contained. N-type layer 26 is doped with an n-type impurity such as phosphorous, arsenic, antimony, or combinations thereof. The n-type impurity is in-situ doped with the proceeding of the respective epitaxy step. The n-type impurity concentration in n-type layer 26 may be between about $1\times10^{14}/cm^3$ and about $1\times10^{16}/cm^3$, for example. In some embodiments, n-type layer 26 has a substantially uniform doping concentration from the bottom to the top. In alternative embodiments, from the bottom to the top, the doping concentration may be increased gradually. Thickness T2 of n-type layer 26 may be between about 1 μm and about 2 μm, for example, although a greater or smaller thickness may be used.

N-type layer 28 may be a silicon layer that is doped with an n-type impurity, wherein the n-type impurity is in-situ doped with the proceeding of the respective epitaxy step. The n-type impurity concentration in n-type layer 28 may be higher than the impurity concentration of n-type layer 26. In some exemplary embodiments, the n-type impurity concentration in n-type layer 28 is between about $1\times10^{15}/cm^3$ and about $1\times10^{17}/cm^3$, for example. In some embodiments, n-type layer 28 has a substantially uniform doping concentration from the bottom to the top. In alternative embodiments, from the bottom to the top, the n-type doping concentration may be increased gradually. Thickness T3 of n-type layer 28 may be between about 1.5 μm and about 2.5 μm, for example, although a greater or smaller thickness may be used.

Although two n-type layers 26 and 28 are illustrated, more n-type layers may be stacked underlying n-type layer 24, between n-type layers 24 and 26, and/or over n-type layer 28. Furthermore, for the stacked n-type layers (24 and 26, and possibly more), the impurity concentrations may be gradually increased from the lower ones of the n-type layers to the upper ones of the n-types.

In some embodiments, p-type layer 30 is a silicon layer. In alternative embodiments, p-type layer 30 is a silicon germanium layer. The atomic percentage of germanium in p-type layer 30 may be between about 20 percent and about 40 percent, for example. With the proceeding of the epitaxy of p-type layer 30, a p-type impurity is in-situ doped to an impurity concentration between about $1 \times 10^{18}/cm^3$ and about $1 \times 10^{20}/cm^3$, for example. In some embodiments, p-type layer 30 has a substantially uniform doping concentration from the top to the bottom. Thickness T4 of p-type layer 24 may be between about 0.1 μm and about 0.5 μm, for example.

Figure 3:
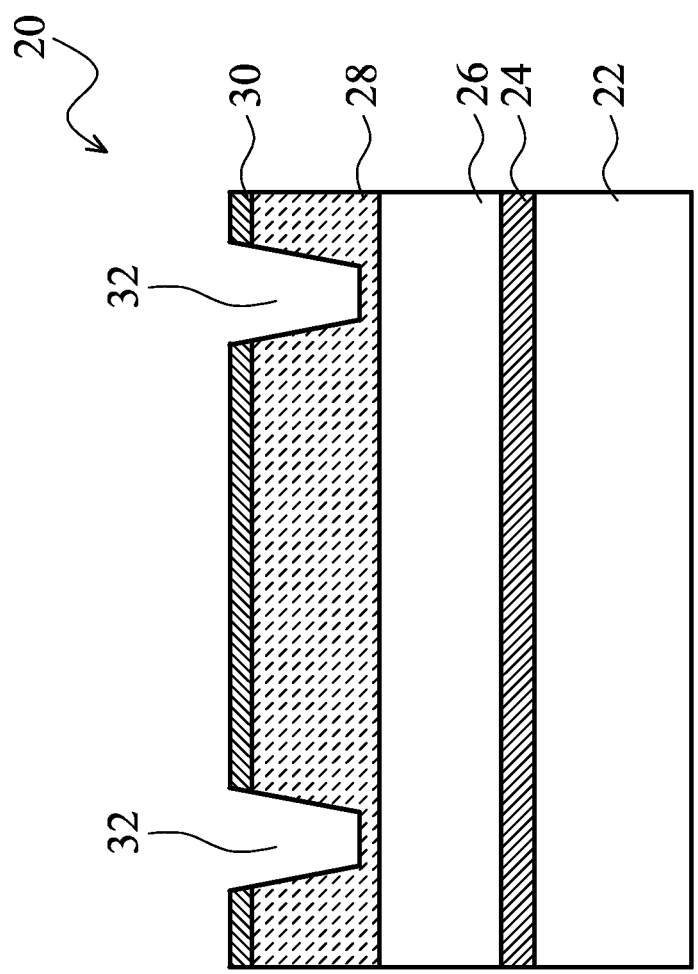
Figure 4:
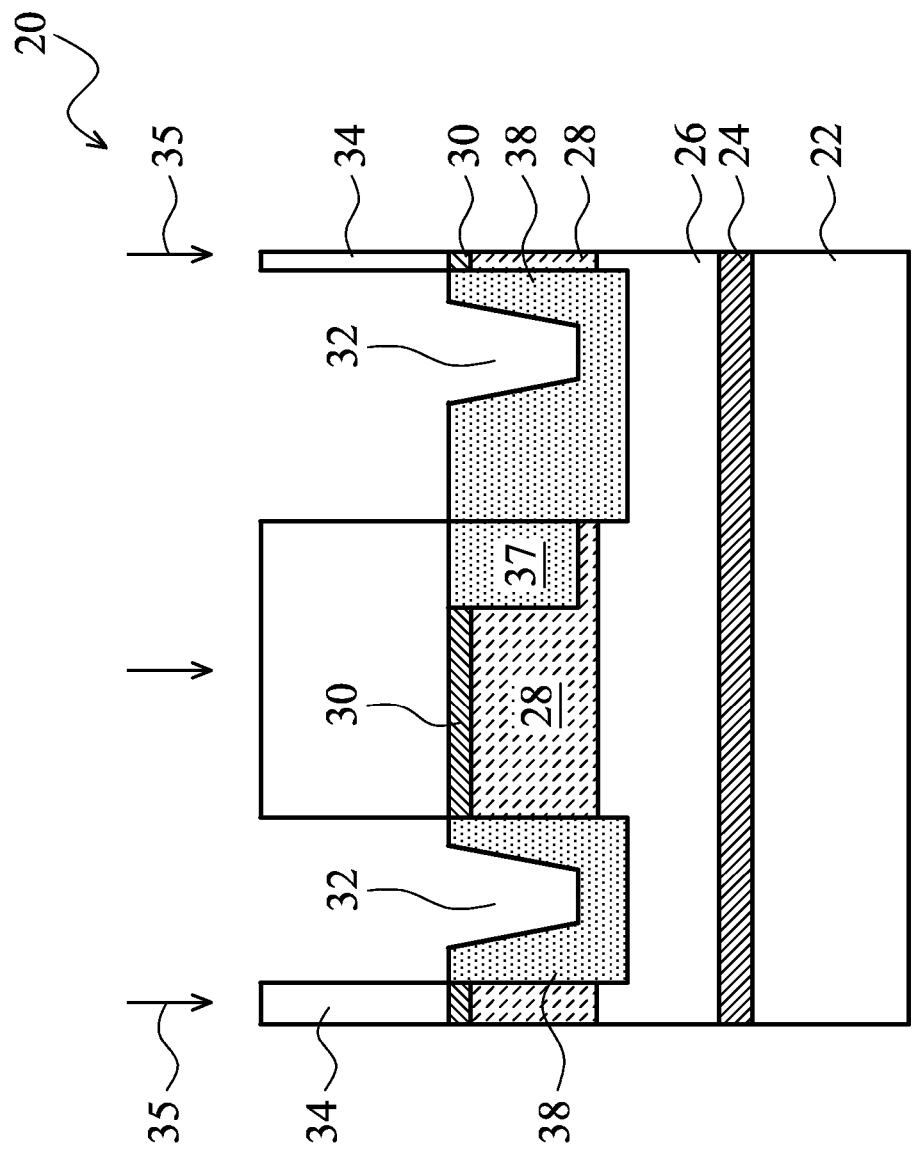

Referring to FIG. 3, Trenches 32 are formed by etching. Trenches 32 extend from the top surface of substrate 22 into substrate 22. Trenches 32 extends into n-type layer 28, and may also extend further down into n-type layer 26 or p-type layer 24 in accordance with some embodiments. Next, as shown in FIG. 4, photo resist 34 is formed and patterned, and trenches 32 may be exposed through the openings in photo resist 34. An implantation (symbolized by arrows 35) or a plurality of implantations 35 is then performed using photo resist 34 as an implantation mask. During the implantation, a p-type impurity is implanted into substrate 22, so that p-type regions 38 are formed. Although p-type regions 38 appear to be discrete regions that are separate from each other in FIG. 4, the discrete regions 38 may be portions of ring when viewed from top of the structure in FIG. 4. P-type regions 38 are also referred to as a Field (area) Light Doping (FLD) region. P-type regions 38 may have a p-type impurity concentration between about $10^{14}/cm^3$ and about $10^{18}/cm^3$, for example. After the formation of p-type regions 38, photo resist 34 is removed.

FIG. 4 also illustrates the formation of p-type layer 37, which is also formed through an implantation. The photo resist that is used as the implantation mask is not shown herein. P-type layer 37 is in the region encircled by the ring formed of p-type regions 38. The p-type impurity concentration of p-type layer 37 may be between about $10^{14}/cm^3$ and about $10^{18}/cm^3$, for example.

Figure 5:
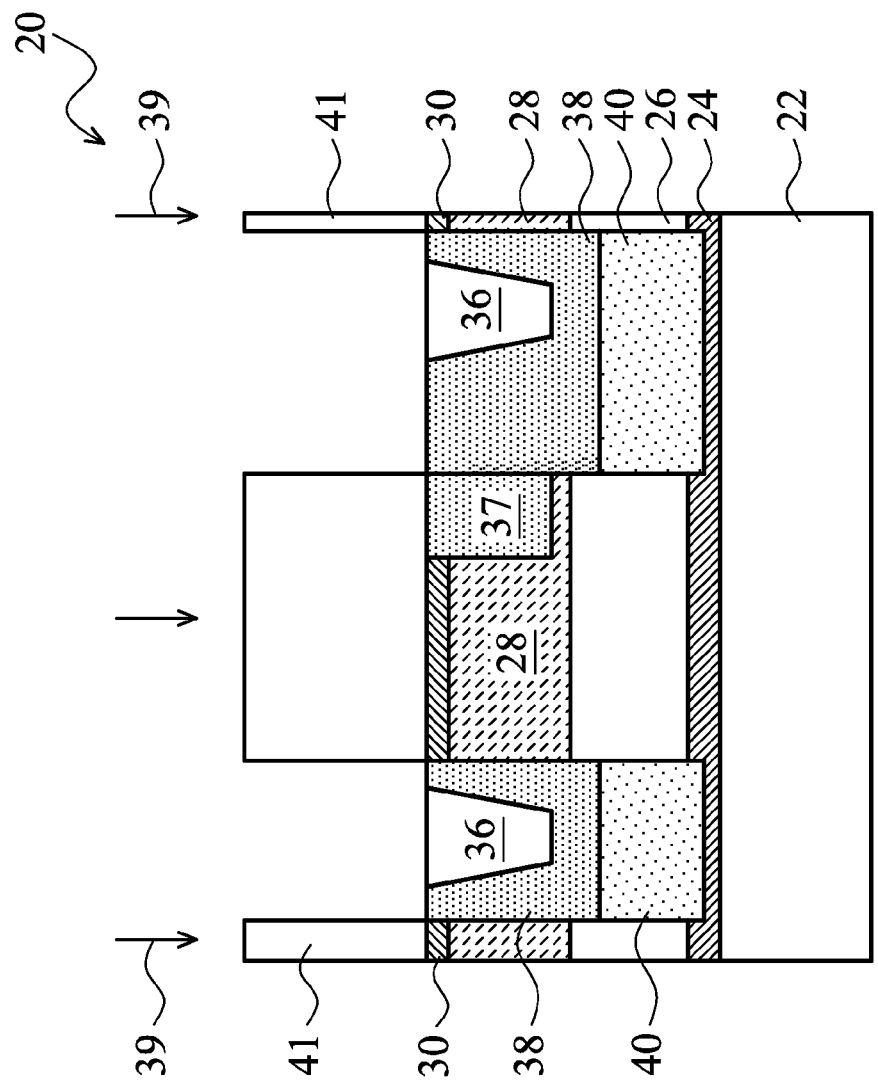

FIG. 5 illustrates the formation of isolation regions 36 and deep well regions 40. Isolation regions 36 are also referred to as Shallow Trench Isolation (STI) regions 36 hereinafter. The formation of STI regions 36 may include filling a dielectric material into trenches 32 (FIG. 4), and then performing a Chemical Mechanical Polish (CMP) to remove excess portions of the dielectric material, which excess portions are over substrate 22. The remaining portions of the dielectric material form STI regions 36.

Next, photo resist 41 is formed and patterned. STI regions 36 may be exposed through the openings in photo resist 41. An implantation or a plurality of implantations 39 is then performed to implant a p-type impurity into substrate 22, so that deep well regions 40 are formed. Deep well regions 40 may have a p-type impurity concentration between about $10^{14}/cm^3$ and about $10^{18}/cm^3$, for example. Deep well regions 40 are underlying, and may be overlapped by, p-type regions 38. P-type regions 38 and deep well regions 40 are also referred to as semiconductor isolation regions throughout the description. After the formation of deep well regions 40, photo resist 41 is then removed.

Figure 6:
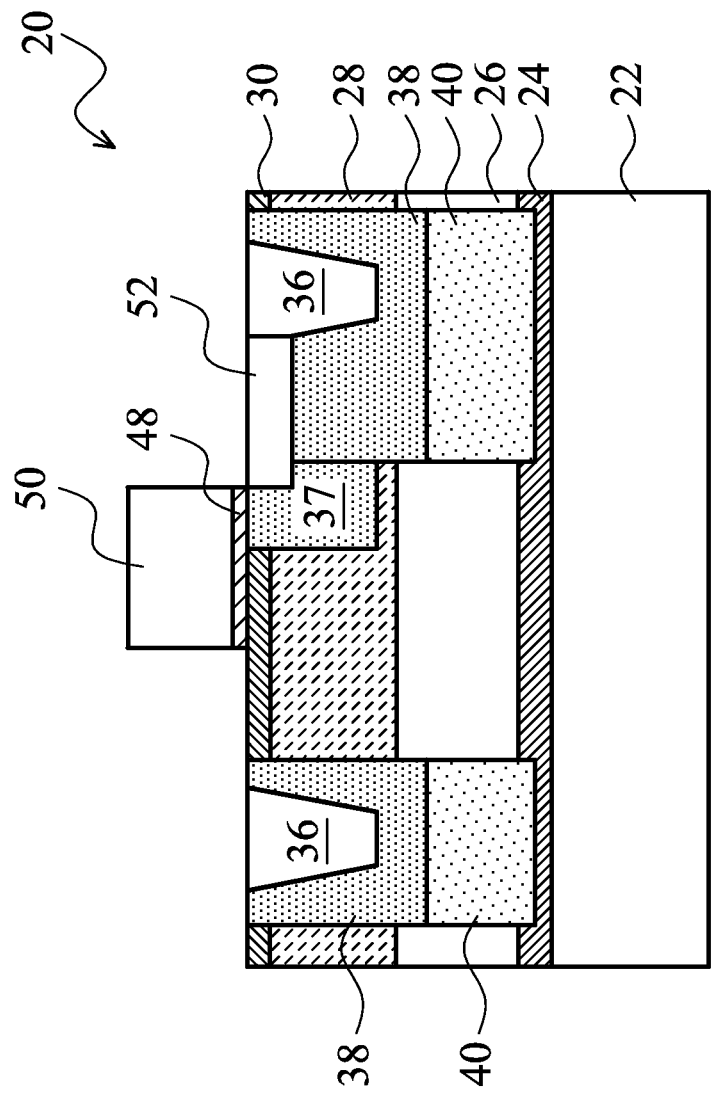

Referring to FIG. 6, gate dielectric 48 and gate electrode 50 are formed. Gate dielectric 48 may include an oxide, a nitride, an oxynitride, a carbide, combinations thereof, and/or multi-layers thereof. Gate electrode 50 is conductive or semi-conductive. In some embodiments, gate electrode 50 is formed of polysilicon. In alternative embodiments, gate electrode 50 is formed of other conductive materials such as metals, metal silicides, metal nitrides, and combinations thereof. The formation of gate dielectric 48 and gate electrode 50 includes forming a blanket gate dielectric layer and a blanket gate electrode layer, and then patterning the gate dielectric layer and the gate electrode layer. Gate electrode 50 overlaps a portion of p-type region 37.

After the formation of gate dielectric 48 and gate electrode 50, Lightly Doped Drain/source (LDD) region 52 is formed, for example, through an implantation of an n-type impurity. Gate electrode 50 may be used as an implantation mask, so that the illustrated left edge of LDD region 52 is substantially aligned to the illustrated right edge of gate electrode 50.

Figure 7:
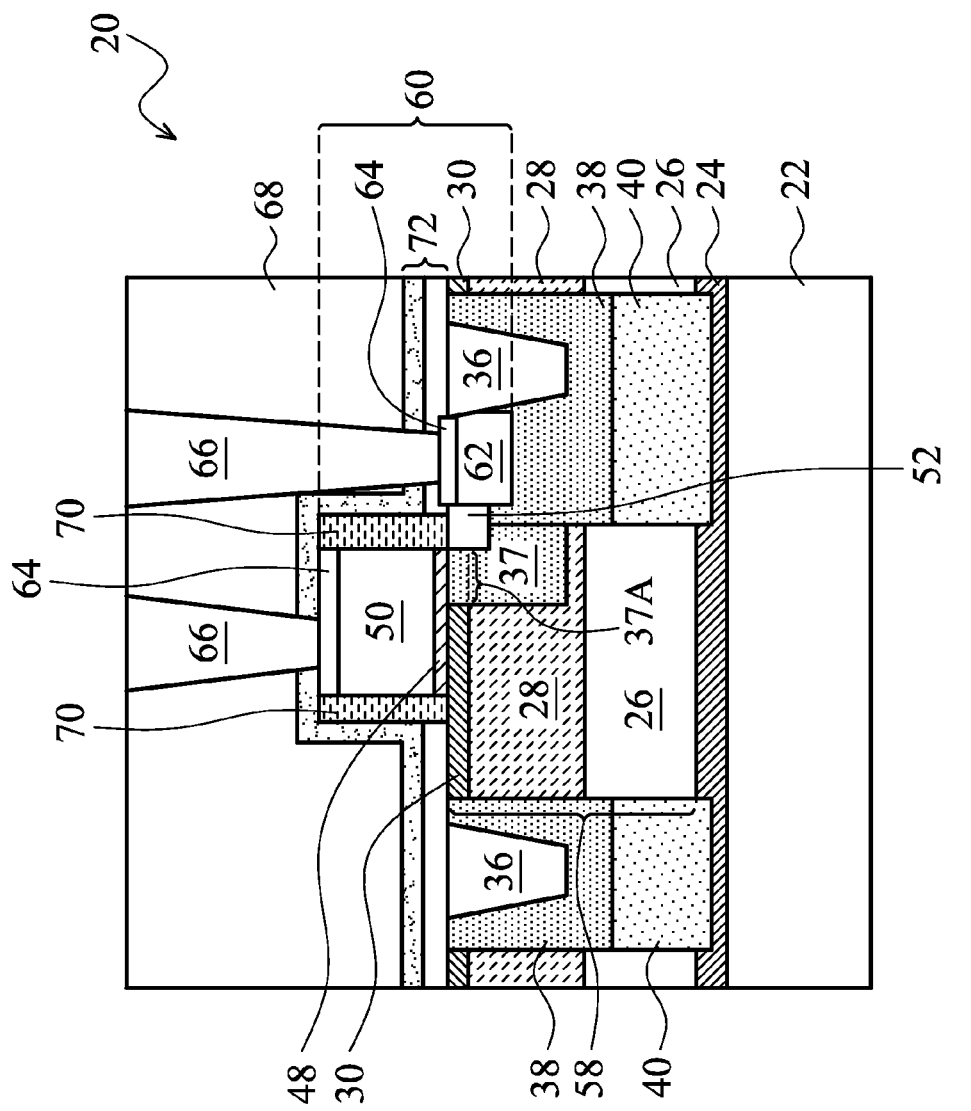

FIG. 7 illustrates the formation of the remaining portions of transistor 60 that includes gate dielectric 48 and gate electrode 50 as the gate stack. The remaining portions of transistor 60 further include heavily doped n-type region 62, silicide regions 64, and gate spacers 70. Heavily doped n-type region 62 is a source or drain region (referred to as source/drain region hereinafter) of transistor 60. In addition, contact plugs 66, Inter-Layer Dielectric (ILD) 68, Resist Protective oxide (RPO) and Contact Etch Stop Layer (CESL) 72, etc. are also formed.

In the resulting structure as in FIG. 7, photo diode 58 is formed. Photo diode 58 includes p-type layer 30 as the p-side of photo diode 58, and n-type layers 26 and 28 as the n-side of photo diode 58. The n-side of photo diode 58 forms the p-n junction with the p-side. Throughout the description, the portion of p-type layer 30 and n-type layers 26 and 28 that are encircled by semiconductor isolation regions 38 and 40 are alternatively referred to as p-type region 30, n-type region 26, and n-type region 28, respectively.

In the resulting structure in FIG. 7, portion 37A of p-type region 37 forms the channel region of transistor 60. Photo diode 58 and transistor 60 act as the photo diode and the transfer gate transistor of a same image sensor unit. When transistor 60 is turned on, channel 37A acts as the electrical connection between photo diode 58 and source/drain region 62. The charges generated by photo diode 58 may thus flow through channel 37A to source/drain region 62, from which the charges may be collected and processed into electrical signals of the respective image sensor unit. When transistor 60 is turned off, the electrical connection between photo diode 58 and source/drain region 62 is disconnected.

Figure 8:
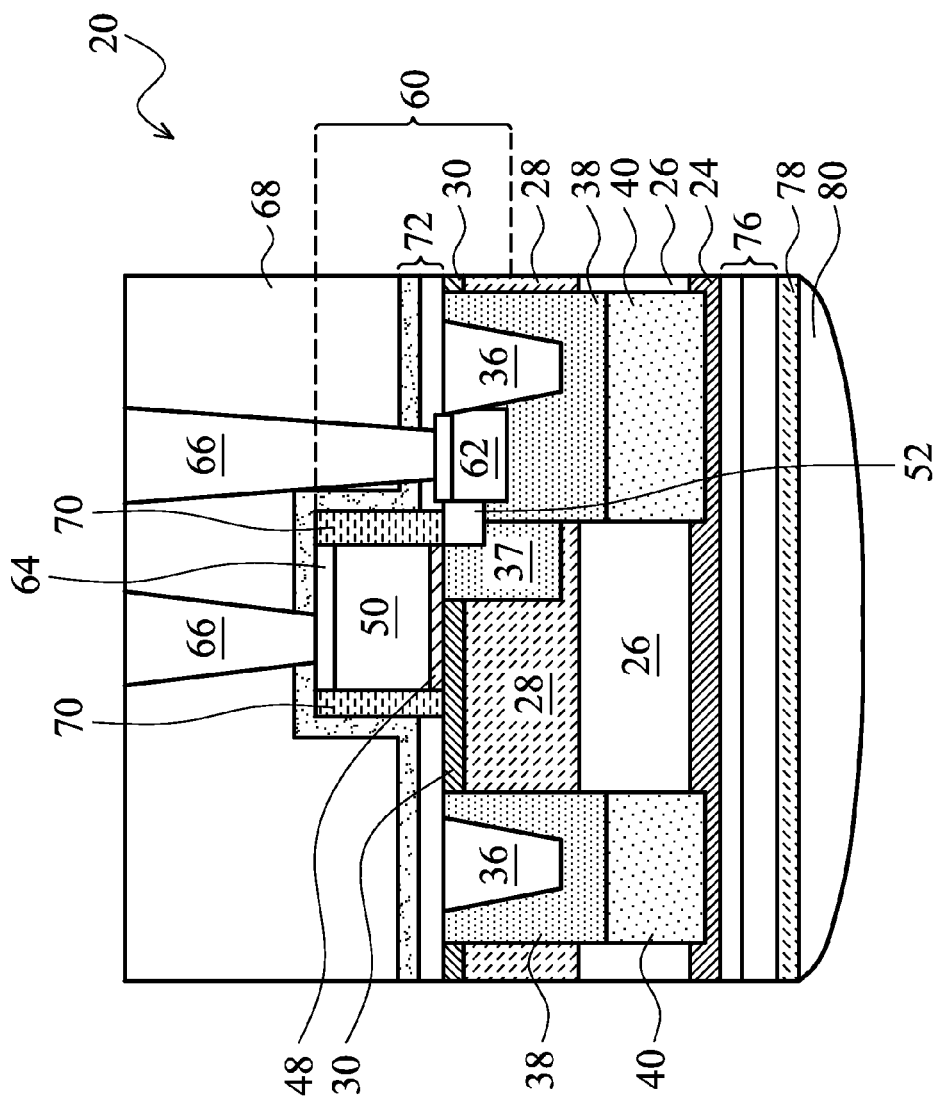

In accordance with some embodiments, some backside processes may be performed to form wafer 20 as a Backside Illumination (BSI) image sensor wafer, which includes a plurality of image sensor chips therein. In the backside process, a thinning process (such as a grinding) is first performed to remove substrate 22, as shown in FIG. 8. In the embodiments wherein p-type layer 24 is formed to have a thickness greater than desirable, p-type layer 24 may be thinned, for example, to a thickness smaller than about 0.1 μm. In the embodiments wherein p-type layer 24 is already thin enough, the thinning on p-type layer 24 may be omitted. If the epitaxy layers (FIG. 1) do not include p-type layer 24, however, an implantation or an epitaxy step may be performed on the backside of n-type layer 26, so that a p-type layer essentially the same as p-type layer 24 is formed.

In subsequent process steps, BSI film stacks 76 are formed, which may include oxide layers, high-k dielectric layers (such as hafnium oxide, zirconium oxide, or the like), anti-reflective layers, metal grids, or the like). Additional components such as color filters 78 and micro-lenses 80 are then formed. In alternative embodiments (not shown), process steps are continued (starting from the structure in FIG. 7) to form wafer 20 as a front side illumination image sensor wafer, wherein metal layers (not shown), color filters 78, and micro-lenses 80 are formed over the illustrated structure in FIG. 7.

Although the impurity type of the doped semiconductor regions (such as regions 24, 26, 28, 30, 38, 40, 52, and 62, etc.) are specified in the illustrated embodiments, the teaching of the embodiments is readily available for the formation of a device with conductivity types of these doped semiconductor regions inverted.

In the embodiments, the p-type and n-type regions of photo diode 58 are formed by epitaxy rather than implantation. Accordingly, the dopant concentrations throughout each of the layers 24, 26, 28, and 30 may be substantially uniform even after the subsequent thermal steps due to the small diffusion distance of impurities in the epitaxy layers.

Due to the formation of photo diode 58 using epitaxy, the thickness of p-type region 30 and n-type regions 26 and 28 may be increased to desirable values, and the impurity concentrations may also be increased to desirable values, without incurring the damage that occurs in the implantations. The leakage currents of the resulting diodes are thus small. The dark current and white pixel performance of the resulting image sensors is thus improved. Furthermore, the epitaxy makes the formation of silicon germanium p-type layer 24 possible. Since n-type layer 26 may be a silicon layer that is substantially germanium free. A stress may be generated in the silicon germanium containing p-type layer 24, and results in the further reduction of leakage currents of photo diode 58. This also results in the improvement of the dark current and white pixel performance of the resulting image sensors.

In accordance with embodiments, a method includes performing a first epitaxy to grow a first epitaxy layer of a first conductivity type, and performing a second epitaxy to grow a second epitaxy layer of a second conductivity type opposite the first conductivity type over the first epitaxy layer. The first and the second epitaxy layers form a diode. The method further includes forming a gate dielectric over the first epitaxy layer, forming a gate electrode over the gate dielectric, and implanting a top portion of the first epitaxy layer and the second epitaxy layer to form a source/drain region adjacent to the gate dielectric.

In accordance with other embodiments, a method includes epitaxially growing a first epitaxy layer over a semiconductor substrate, epitaxially growing a second epitaxy layer over the first epitaxy layer, epitaxially growing a third epitaxy layer over the second epitaxy layer, and epitaxially growing a fourth epitaxy layer over the third epitaxy layer. The second and the third epitaxy layers are in-situ doped with impurities of a first conductivity type. The first and the fourth epitaxy layers are in-situ doped with impurities of a second conductivity type opposite to the first conductivity type. The method further includes implanting the third epitaxy layer and the fourth epitaxy layer to form a semiconductor insulation region of the second conductivity type, wherein a portion of the third epitaxy layer and a portion of the fourth epitaxy layer are encircled by the semiconductor insulation region to form a photo diode. A gate dielectric and a gate electrode are formed over the fourth epitaxy layer. The fourth epitaxy layer is implanted to form a source/drain region of the first conductivity type, wherein the source/drain region, the gate dielectric, and the gate electrode form portions of a transistor.

In accordance with yet other embodiments, a device includes a photo diode, which includes a first semiconductor layer of a first conductivity type, and a second semiconductor layer over the first semiconductor layer and of a second conductivity type opposite the first conductivity type. At least one of the first and the second semiconductor layers has a substantially uniform impurity distribution. A gate dielectric is over the second semiconductor layer. A gate electrode is over the gate dielectric. A source/drain region of the first conductivity type is adjacent to the gate electrode. The source/drain region, the gate dielectric, and the gate electrode form portions of a transistor. The transistor is configured to turn on and turn off an electrical connection between the photo diode and the source/drain region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a first epitaxy to grow a first epitaxy layer of a first conductivity type;
    performing a second epitaxy to grow a second epitaxy layer over the first epitaxy layer, wherein the second epitaxy layer is of a second conductivity type opposite the first conductivity type, and wherein the first and the second epitaxy layers form a diode;
    implanting the first epitaxy layer and the second epitaxy layer to form a semiconductor isolation region extending into the first epitaxy layer and the second epitaxy layer, wherein the semiconductor isolation region is of the second conductivity type;
    forming a gate dielectric over the first epitaxy layer;
    forming a gate electrode over the gate dielectric; and
    implanting a top portion of the first epitaxy layer and the second epitaxy layer to form a source/drain region adjacent to the gate dielectric, wherein the source/drain region is located in the semiconductor isolation region.

2. The method of claim 1, wherein the first and the second epitaxy layers are grown over a semiconductor substrate, and where the method further comprises:
    performing a thinning step to remove the semiconductor substrate; and
    forming a color filter and a micro-lens aligned to the diode, wherein the color filter and the micro-lens are on an opposite side of the first and the second epitaxy layers than the gate electrode.

3. The method of claim 1, wherein the semiconductor isolation region encircles the diode.

4. The method of claim 1 further comprising, before the first and the second epitaxy layers are grown, performing a third epitaxy step to grow a third epitaxy layer of the second conductivity type, wherein the first epitaxy layer is grown over the third epitaxy layer.

5. The method of claim 4, wherein the third epitaxy layer comprises silicon germanium, and wherein the first epitaxy layer is a silicon layer that is substantially free from germanium.

6. The method of claim 1 further comprising, before the first and the second epitaxy layers are grown, performing a third epitaxy step to grow a third epitaxy layer of the first conductivity type, wherein the third epitaxy layer has an impurity concentration lower than an impurity concentration of the first epitaxy layer.

7. The method of claim 1, wherein the second epitaxy comprises growing the second epitaxy layer as a silicon germanium layer.

8. The method of claim 1 further comprising implanting the first epitaxy layer and the second epitaxy layer to form a doped layer of the second conductivity type, wherein the gate dielectric and the gate electrode overlap a portion of the doped layer to form a transistor, with a portion of the doped layer configured as a channel of the transistor.

9. A method comprising:
   epitaxially growing a first epitaxy layer over a semiconductor substrate;
   epitaxially growing a second epitaxy layer over the first epitaxy layer;
   epitaxially growing a third epitaxy layer over the second epitaxy layer;
   epitaxially growing a fourth epitaxy layer over the third epitaxy layer, wherein the second and the third epitaxy layers are in-situ doped with impurities of a first conductivity type, and wherein the first and the fourth epitaxy layers are in-situ doped with impurities of a second conductivity type opposite the first conductivity type;
   implanting the third epitaxy layer and the fourth epitaxy layer to form a semiconductor insulation region of the second conductivity type, wherein a portion of the third epitaxy layer and a portion of the fourth epitaxy layer are encircled by the semiconductor insulation region to form a photo diode;
   forming a gate dielectric over the fourth epitaxy layer;
   forming a gate electrode over the gate dielectric; and
   implanting the fourth epitaxy layer to form a source/drain region of the first conductivity type, wherein the source/drain region, the gate dielectric, and the gate electrode form portions of a transistor.

10. The method of claim 9, wherein the step of epitaxially growing the first epitaxy layer comprises growing silicon germanium, and wherein the step of epitaxially growing the second epitaxy layer comprises growing silicon, with the second epitaxy layer being substantially free from germanium.

11. The method of claim 9, wherein the step of epitaxially growing the fourth epitaxy layer comprises growing silicon germanium.

12. The method of claim 9 further comprising, performing a thinning step to remove the semiconductor substrate, until the first epitaxy layer is exposed, wherein the method further comprises:
   forming a color filter and a micro-lens aligned to the photo diode, wherein the color filter and the micro-lens are on an opposite side of the first epitaxy layer than the gate electrode.

13. The method of claim 9 further comprising, implanting the third epitaxy layer to form a doped layer of the second conductivity type, wherein the gate dielectric and the gate electrode overlaps a portion of the doped layer to form a transistor, and wherein the photo diode and the source/drain region are on opposite sides of a channel of the transistor.

14. The method of claim 9, wherein the third epitaxy layer is in-situ doped to an impurity concentration higher than an impurity concentration in the second epitaxy layer.

15. The method of claim 9, wherein the first conductivity type is n-type, and the second conductivity type is p-type.

16. The method of claim 9, wherein the source/drain region is in the semiconductor insulation region.

17. The method of claim 9, wherein the third epitaxy layer and the fourth epitaxy layer forming an anode and a cathode, respectively, of the diode, and wherein the cathode is configured as an addition source/drain region of the transistor.

18. A method comprising:
   epitaxially growing a first epitaxy layer over a semiconductor substrate;
   epitaxially growing a second epitaxy layer over the first epitaxy layer;
   epitaxially growing a third epitaxy layer over the second epitaxy layer;
   epitaxially growing a fourth epitaxy layer over the third epitaxy layer, wherein the second and the third epitaxy layers are in-situ doped with impurities of a first conductivity type, and wherein the first and the fourth epitaxy layers are in-situ doped with impurities of a second conductivity type opposite the first conductivity type;
   implanting the third epitaxy layer and the fourth epitaxy layer to form a semiconductor insulation region of the second conductivity type, wherein a portion of the third epitaxy layer and a portion of the fourth epitaxy layer are encircled by the semiconductor insulation region to form a photo diode;
   implanting the third epitaxy layer to form a doped layer of the second conductivity type;
   forming a gate dielectric over the fourth epitaxy layer;
   forming a gate electrode over the gate dielectric, wherein the gate dielectric and the gate electrode overlap a portion of the doped layer; and
   implanting the fourth epitaxy layer to form a source/drain region of the first conductivity type, wherein the source/drain region, the gate dielectric, and the gate electrode form portions of a transistor, and wherein the photo diode and the source/drain region are on opposite sides of a channel of the transistor.

19. The method of claim 18 further comprising performing a thinning step to remove the semiconductor substrate until the first epitaxy layer is exposed, wherein the method further comprises:
   forming a color filter and a micro-lens aligned to the photo diode, wherein the color filter and the micro-lens are on an opposite side of the first epitaxy layer than the gate electrode.

20. The method of claim 18, wherein the third epitaxy layer is in-situ doped to an impurity concentration higher than an impurity concentration in the second epitaxy layer.

21. The method of claim 18, wherein the first conductivity type is n-type, and the second conductivity type is p-type.

* * * * *